(12) United States Patent
Li et al.

(10) Patent No.: US 9,755,605 B1
(45) Date of Patent: Sep. 5, 2017

(54) VOLUME CONTROL

(71) Applicant: Amazon Technologies, Inc., Seattle, WA (US)

(72) Inventors: Meng Li, San Francisco, CA (US); Arnaud Jean-Louis Charton, Livermore, CA (US); Catherine Michelle Loo, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 495 days.

(21) Appl. No.: 14/032,081

(22) Filed: Sep. 19, 2013

(51) Int. Cl.
*H03G 7/00* (2006.01)

(52) U.S. Cl.
CPC ..................... *H03G 7/00* (2013.01)

(58) Field of Classification Search
CPC ..................................................... H03G 7/00
USPC ........ 381/99, 104, 107, 28, 71.1; 340/392.3; 84/737; 703/6; 375/332
See application file for complete search history.

(56) References Cited

U.S. PATENT DOCUMENTS

| | | | | |
|---|---|---|---|---|
| 4,531,224 | A * | 7/1985 | McCallister | H04L 7/0274 375/332 |
| 7,418,392 | B1 | 8/2008 | Mozer et al. | |
| 7,720,683 | B1 | 5/2010 | Vermeulen et al. | |
| 7,774,204 | B2 | 8/2010 | Mozer et al. | |
| 2007/0131101 | A1 * | 6/2007 | Doering | G10H 1/342 84/737 |
| 2011/0305346 | A1 * | 12/2011 | Daubigny | H03G 3/32 381/28 |
| 2011/0311067 | A1 * | 12/2011 | Harris | H03G 3/3089 381/71.1 |
| 2012/0197612 | A1 * | 8/2012 | Drews | G01H 3/10 703/6 |
| 2012/0223885 | A1 | 9/2012 | Perez | |

FOREIGN PATENT DOCUMENTS

WO     WO2011088053 A2     7/2011

OTHER PUBLICATIONS

Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

* cited by examiner

*Primary Examiner* — Md S Elahee
(74) *Attorney, Agent, or Firm* — Lee & Hayes, PLLC (57) ABSTRACT

This disclosure generally pertains to volume control of audio output by a device. A piecewise curve may be used to implement volume control using two or more curves segments. The piecewise curve may be implemented by a signal converter. The curve segments may be selected to provide volume control that provides incremental changes in amplification at mid-level to high level volumes, while providing anticipated amplification at lower volumes which satisfy users' expectations. In some instances, different piecewise curves may be selected for different types of audio so that these different types of audio are provided to users at an expected volume and/or in a meaningful way. When multiple audio outputs occur at a same time, the piecewise curves associated with some of the audio outputs may be dynamically adjusted or updated based on the presence of the other ones of the multiple audio outputs and/or ambient noise.

21 Claims, 10 Drawing Sheets

VOLUME CONTROL

BACKGROUND

Computing devices such as smart phones, tablets, entertainment systems, notebook computers, and portable communication devices are continually used in new and useful ways to provide communications, information and entertainment to users of the computing devices. Many computing devices are capable of providing audio output such as music, voice commands (e.g., navigation instructions), text-to-speech audio, audio indications (e.g., alarms, warnings, announcements, etc.) and other types of audio feedback or output. Users often expect multi-functional devices to provide audio output in a meaningful way to allow the user to intuitively interact with the devices without a need for excessive amount of user control or adjustment of the audio outputs.

A digital-to-analog converter (DAC) is used to convert a digital signal from an electronic device to an analog signal that is output to a speaker, which generates sound at a volume perceivable by a user. Conventional DACs use a single logarithmic curve to provide the conversion of the digital signal to the analog signal in an attempt to provide a consistent control of volume when a user interacts with a volume control.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This disclosure generally pertains to volume control of audio output by a device. Many devices are controlled by conventional volume controllers (e.g., linear or rotary potentiometers) that are used to provide variable adjustment and fine control of the volume by controlling voltage. Some devices provide a course control, often through a digital interface (e.g., user interface, voice commands, etc.), which may offer less volume control selections or settings within a given range than the fine control provided by conventional volume controllers. For example, a course control may limit volume control settings to basic units such as a volume control of volume=0, 1, 2, 3, . . . , 9 or 10. However, the course controls may use any other predetermined number of possible selections or settings. In contrast, a fine control may not be limited to any predetermined number of possible selections or settings, but instead may provide user control by a variable adjustment along a continuous curve. Some devices provide both fine control and course control depending on an input provided to the device (e.g., turning of a physical rotary knob, receiving a voice command, receiving a selection along a digital slider control on a user interface, etc.).

Although the discussion below refers to curves and curve segments, the piecewise curve represents an underlying contiguous dataset formed from at least two functions that share a common data point. Thus, the contiguous dataset is a dataset that is uninterrupted and lacks breaks or gaps when represented in graphical form, therefore having a continuous set of data points along an axis. The contiguous dataset may include a single unique output value for each unique input value. The contiguous dataset may provide multipliers that are used to convert or modify an input signal. The multipliers may be generated by use of one of the two or more functions. In some instances, the multipliers modify an amplification of input signals to create output signals.

When interacting with a volume control, a user often anticipates a certain volume level of audio output based on a selected setting. In particular, a user often expects the incremental amplification (e.g., increase in volume) to appear to be linear, such that the amount of amplification between each setting or each equal adjustment is relatively the same amount of amplification. For example, an amount of volume change between a volume of 0 and 1 should sound about the same as an amount of volume change between a volume of 6 and 7, and so forth, when a same reference sound is output. In another example, a volume level of 5 should sound about half as loud as a volume of 10. Although this concept may seem simple, in practice this has been difficult to implement in order to accommodate users' expectations, particularly in low volume ranges. As discussed herein, a piecewise curve may be used to implement volume control using two or more curves segments. The curve segments may be selected to provide volume control that provides incremental changes in volume at mid-level to high level volumes, while providing anticipated volume controls as lower volumes which satisfy users' expectations. In some instances, different piecewise curves may be selected for different types of audio so that these different types of audio are provided to users at an expected volume and/or in a meaningful way.

Many types of devices are capable of outputting multiple types of audio at a same time or during a short interval of time, such as simultaneously, nearly simultaneously, or sequentially. For example, a device may play music and output navigational instructions to a user that is navigating to a location. In another example, a device may provide text-to-speech (TTS) audio to a user when providing audio notifications to a user, such as notifications about received messages, notifications about calendar events, and/or other types of notifications. Each of these types of audio outputs may be controlled by a user by way of an adjustment to a volume control. When multiple audio outputs occur at a same time, the piecewise curves associated with some of the audio outputs may be dynamically adjusted or updated based on the presence of the other ones of the multiple audio outputs. In some embodiments, the volume control associated with some of the audio outputs may also be dynamically attenuated based on the presence of the other ones of the multiple audio outputs.

The techniques and systems described herein may be implemented in a number of ways. Example implementations are provided below with reference to the following figures. Although the discussion below involves details of an electronic voice-controlled device 106, the volume control piecewise curves and/or dynamic adjustment of the volume curves may be implemented using virtually any type of electronic device that causes output of audio signals using a signal converter (SC), such as a digital-to-analog converter (DAC), a digital-to-digital converter (DDC), and/or an analog-to-analog converter (AAC). The DDC may be implemented by software, by a digital signal processor (DSP), or a combination of both. In some embodiments, multiple instances of the DAC, the DDC, and/or the AAC may be implemented to process multiple audio input signals. For example, a first DDC may be used to convert a first input single to a first output signal while a second DDC may be used to convert a second input single to a second output signal.

Figure 1:
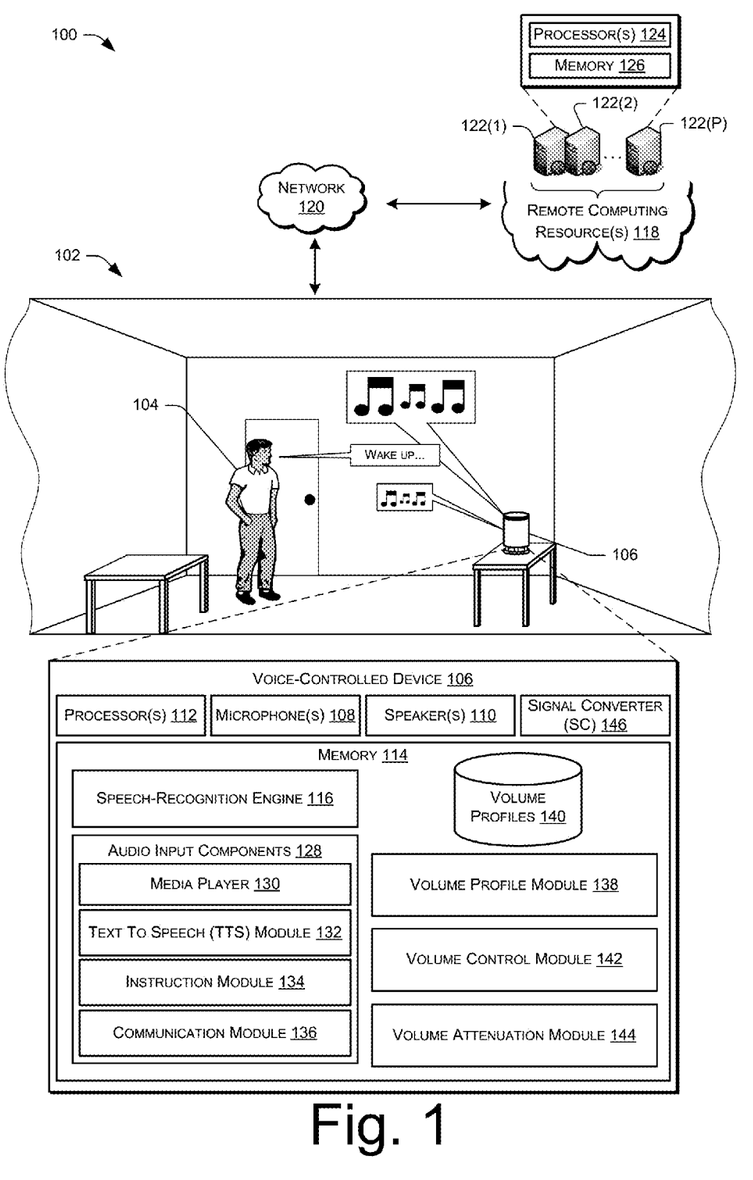
FIG. 1 is a schematic diagram of an illustrative voice interaction computing architecture that includes a voice-controlled device situated in an environment.

FIG. 1 shows an illustrative voice interaction computing architecture 100 set in an environment 102, such as a home environment, that includes a user 104. The architecture 100 also includes an electronic voice-controlled device 106 (interchangeably referred to as "device 106") with which the user 104 may interact. In the illustrated implementation, the voice-controlled device 106 is positioned on a table within a room of the environment 102. In other implementations, it may be placed in any number of locations (e.g., ceiling, wall, in a lamp, beneath a table, under a chair, etc.). Further, more than one device 106 may be positioned in a single room, or one device 106 may be used to accommodate user interactions from more than one room.

Generally, the voice-controlled device 106 may have a microphone unit that includes one or more microphones 108 and a speaker unit that includes at least one speaker 110 to facilitate audio interactions with the user 104 and/or other users. In some instances, the voice-controlled device 106 is implemented without a haptic input component (e.g., keyboard, keypad, touch screen, joystick, control buttons, etc.) or a display. In certain implementations, a limited set of one or more haptic input components may be employed (e.g., a dedicated button to initiate a configuration, power on/off, etc.). Nonetheless, the primary and potentially only mode of user interaction with the electronic device 106 may be through voice input and audible output. One example implementation of the voice-controlled device 106 is provided below in more detail with reference to FIG. 2.

The microphone(s) 108 of the voice-controlled device 106 may detect audio (e.g. audio signals) from the environment 102, such as sounds uttered from the user 104 (e.g., volume control instructions, etc.) and other noise within the environment 102. As illustrated, the voice-controlled device 106 may include a processor 112 and memory 114, which stores or otherwise has access to a speech-recognition engine 116. As used herein, the processor 112 may include multiple processors and/or a processor having multiple cores. The speech-recognition engine 116 may perform speech recognition on audio signals generated by the microphone(s) 108, with these signals being generated from sound within the environment 102, such as utterances spoken by the user 104. The voice-controlled device 106 may perform certain actions in response to recognizing different speech from the user 104. The user 104 may speak predefined commands (e.g., "awake", "sleep", "volume up", "volume four", etc.), or may use natural language commands when interacting with the device 106 (e.g., "Please set the volume to four", "Please tell me what's playing at the local cinema", etc.).

In some instances, the voice-controlled device 106 may operate in conjunction with or may otherwise utilize computing resources 118 that are remote from the environment 102. For instance, the voice-controlled device 106 may couple to the remote computing resources 118 over a network 120. As illustrated, the remote computing resources 118 may be implemented as one or more servers 122(1), 122(2), . . . , 122(P) and may, in some instances, form a portion of a network-accessible computing platform implemented as a computing infrastructure of processors 112, storage, software, data access, and so forth that is maintained and accessible via a network 120 such as the Internet. The remote computing resources 118 may not require end-user knowledge of the physical location and configuration of the system that delivers the services. Common expressions associated for these remote computing resources 118 may include "on-demand computing", "software as a service (SaaS)", "platform computing", "network-accessible platform", "cloud services", "data centers", and so forth.

The servers 122(1), 122(2), . . . , 122(P) may include processor(s) 124 and memory 126, which may store or otherwise have access to some or all of the components described with reference to the memory 114 of the voice-controlled device 106. For instance, the memory 126 may have access to and utilize the speech-recognition engine 116 for receiving audio signals from the device 106, recognizing, and differentiating between, speech and other noise and, potentially, causing an action to be performed in response. In some examples, the voice-controlled device 106 may upload audio data to the remote computing resources 118 for processing, given that the remote computing resources 118 may have a computational capacity that exceeds the computational capacity of the voice-controlled device 106. Therefore, the voice-controlled device 106 may utilize the speech-recognition engine 116 at the remote computing resources 118 for performing relatively complex analysis on audio captured from the environment 102. Regardless of whether the speech recognition occurs locally or remotely from the environment 102, the voice-controlled device 106 may receive vocal input from the user 104 and the device 106 and/or the resources 118 may perform speech recognition to interpret a user's operational request or command.

The voice-controlled device 106 may communicatively couple to the network 120 via wired technologies (e.g., wires, universal serial bus (USB), fiber optic cable, etc.), wireless technologies (e.g., radio frequencies (RF), cellular, mobile telephone networks, satellite, Bluetooth, etc.), or other connection technologies. The network 120 is representative of any type of communication network, including data and/or voice network, and may be implemented using wired infrastructure (e.g., coaxial cable, fiber optic cable, etc.), a wireless infrastructure (e.g., RF, cellular, microwave, satellite, Bluetooth®, etc.), and/or other connection technologies.

As illustrated, the memory 114 of the voice-controlled device 106 may also store or otherwise has access to the speech recognition engine 116, audio input components 128, a volume profile module 138, volume profiles 140, a volume control module 142, and a volume attenuation module 144. Although not shown, in other embodiments, the speech recognition engine 116, the audio input components 128, the volume profile module 138, the volume profiles 140, the volume control module 142, and/or the volume attenuation module 144 may be maintained by, or associated with, one of the remote computing resources 118.

In accordance with various embodiments, the audio input components 128 may include a media player 130, a text-to-speech (TTS) module 132, an instruction module 134, and/or a communications module 134, each described in turn.

The media player 130 may function to output any type of media content on any type of output component of the device 106. For example, the media player 130 may read data and cause outputs of audio (e.g., music, book readings, podcasts, etc.) and/or video.

The TTS module 132 may output speech based on textual data or inputs. For example the TTS module 132 may provide audio output that reads text in an electronic message such as an email or text message, announce results of a search, and/or read other types of text.

The instruction module 134 may output audio that provides instructions to a user. The instructions may be system level instructions and/or application level instructions. For example, system level instructions may include warning messages, warning sounds, alarms, and so forth. Examples of application level instructions may include audio driving instructions provided by a navigation application (e.g., "turn left in 500 feet," etc.), input instructions (e.g., "please say your name," etc.) and so forth.

The communications module 134 may output communication audio from a voice communication with another user or users. For example, the voice communication may be conducted via a mobile telephone network, a traditional telephone network, or a voice-over internet protocol (VoIP) network.

By interacting with any of the audio input components, the user of the device may cause audio to be output by the device, using a signal converter (SC) 146, where the audio is subject to volume control using piecewise curves. The SC 146 may be implemented by software, hardware, or a combination of both. The SC 146 may be capable of implementing various different types of piecewise curves from a plurality of stored curves. In various embodiments, the piecewise curves may be implemented by a DAC. In some embodiments, the piecewise curves may be implemented by a DDC or an AAC, as discussed below. For example, digital signals may be preprocessed by a DDC that implements the piecewise curves, and then processed by the DAC to create the audio signals. When the piecewise curves are implemented by an AAC, the AAC may perform post-processing to modify an analog output from the DAC. Features that provide the volume control of the audio input components are discussed next.

The volume profile manager 138 may create, assign, and/or determine a piecewise curve for an audio source. The audio source may be one of the various modules as described above, including the media player 130, the TTS module 132, the instruction module 134, and/or the communications module 134. The audio source may be grouped by other attributes or may be treated individually for each particular piece of audio, such as by each file that includes audio information or each application that causes output of audio. The piecewise curve may include two or more curve segments that, when joined, create the piecewise curve that provides a digital-to-analog conversion to produce a volume control that is anticipated by a user. The volume control may store the piecewise curves or data used to generate the piecewise curves in the volume profiles 140 in association with one or more audio sources. The piecewise curves may include a continuous curve, step functions, or a combination of both.

The volume control module 142 may control volume of the audio sources using respective piecewise curves associated with the audio sources. Thus, the volume control module 142 may function as the SC 146 (e.g., when the SC 146 is implemented in software) or may function to control the SC 146 (e.g., when the SC 146 is at least partially implemented as hardware such as a DAC or an AAC). The volume control module 142 may receive an input from a physical volume control (e.g., a potentiometer, etc.) and/or a non-physical volume control (e.g., a voice command input, a selection on a user interface, etc.). The inputs received by the volume control module 142 may correspond to locations along the piecewise curves. For example, volume inputs of volume=0, 1, 2, . . . , 9, and 10 may be associated with specific locations along the piecewise curve, which when selected, cause a change in amplification of audio signals. When implemented using the DAC, the piecewise curve may cause a voltage adjustment to control an output of the DAC, thereby providing an analog signal with an associated volume level (e.g., amplification level) that is anticipated or expected by the user. When implemented using a DDC, the piecewise curve may be used to convert a digital input signal into a digital output signal, and thereby provide digital amplification. When implemented using an AAC, the piecewise curve may be used to convert an analog input signal into analog output signal, and thereby provide analog amplification.

In some embodiments, the volume control module 142 may dynamically update or adjust a piecewise curve associated with some of the audio outputs based on the presence of other ones of the multiple audio outputs that are output at a same time or near a same time (e.g., one right after another, alternating, etc.). In various embodiments, the volume control module 142 may dynamically update or adjust a piecewise curve associated with some of the audio outputs (or inputs) based on the presence of other ones of the multiple audio outputs (or inputs) when the audio outputs cause audible interference that makes it difficult for a user to distinguish between the audio outputs and/or hear important information in one of the audio outputs (e.g., alarms, instructions, etc.). As an example, when the media player 130 is emitting music and the instruction module 134 is emitting driving directions, the volume control module 142 may modify or update (e.g., replace, etc.) the piecewise curve associated with the music to ensure that the driving directions can be heard over the music. However, the volume control module 142 may not attenuate the volume of the music (e.g., change the volume input), but may adjust the piecewise curve such that a given volume input results in a lower observed volume by the user based on the piecewise curve. For example, the user may set a volume of the device at a level of 5. In the scenario described above, both the music and the driving directions may be output at a volume of 5. However, after the piecewise curve of the music is adjusted, at least temporarily, the music may still be associated with an input of a volume of 5, but may cause a lower amplification, and thus a quieter sounding output to be emitted by speakers with a same input of a volume of 5. Thus, the volume input is not changed, but the piecewise curve may be modified to provide a different output for a same volume input. Furthermore, the volume control module 142 may analyze audio inputs, audio outputs, or both to determine an existence of the audible interference.

In accordance with one or more embodiments, the volume control module 142 may dynamically update or adjust a piecewise curve associated with some of the audio outputs based on ambient noise in an environment. For example, the device may determine a noise floor, which may be based on an amount of ambient noise measured over a period of time. The volume control module 142 may then adjust the piecewise curve based on the noise floor. The adjustment may include a dynamic selection of different curve segments that are used to construct the piecewise curve, rather than just subjecting the piecewise curve to a single multiplier (e.g., reduce output by multiplying output by 0.8, increase output by multiplying output by 1.33, etc.).

The volume attenuation module 144 may dynamically attenuate volume control associated with some of the multiple audio outputs based on the presence of other ones of the multiple audio outputs that are output at or near a same time. The volume attenuation module 144 may perform the attenuation dynamically by lowering, at least temporarily, a volume input associated with the audio output. For example, if the volume input is a volume control of 5, then the volume attenuation module 144 may reduce the volume to a lower value, such as 4, 1.2, or 0 (among many possible values).

Figure 2:
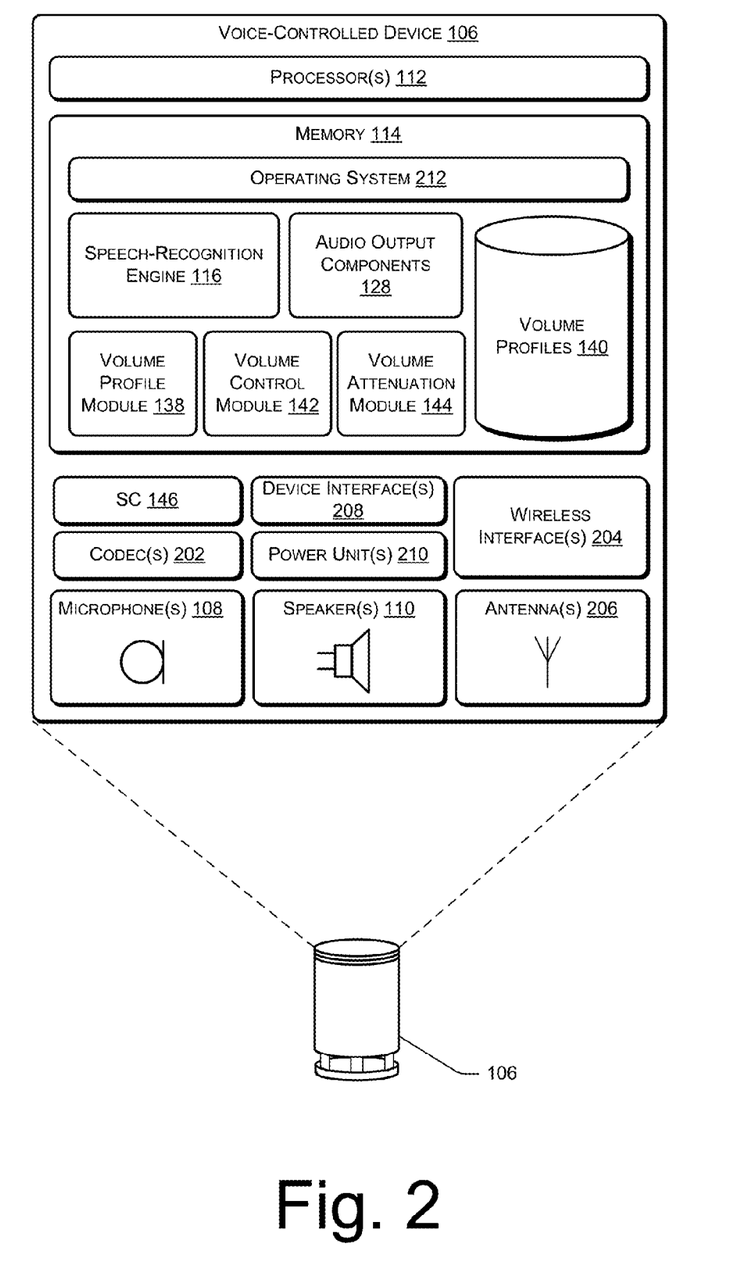
FIG. 2 is a block diagram of selected functional components implemented in the voice-controlled device of FIG. 1.

FIG. 2 shows selected functional components and/or modules of one implementation of the voice-controlled device 106 in more detail. Generally, the voice-controlled device 106 may be implemented as a standalone device 106 that is relatively simple in terms of functional capabilities with limited input/output components, memory 114 and processing capabilities. For instance, the voice-controlled device 106 may not have a keyboard, keypad, or other form of mechanical input in some implementations, nor does it have a display or touch screen to facilitate visual presentation and user touch input. Instead, the device 106 may be implemented with the ability to receive and output audio, a network interface (wireless or wire-based), power, and limited processing/memory capabilities.

In the illustrated implementation, the voice-controlled device 106 may include the processor 112 and memory 114. The memory 114 may include computer-readable storage media ("CRSM"), which may be any available physical media accessible by the processor 112 to execute instructions stored on the memory 114. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other medium which can be used to store the desired information and which can be accessed by the processor 112.

The voice-controlled device 106 may include a microphone unit that comprises the one or more microphones 108 to receive audio input, such as user voice input, a reference sound, and/or other noise (e.g., ambient noise used to determine a noise floor, etc.). The device 106 may also include a speaker unit that includes the speaker(s) 110 to output audio sounds. However the speakers may be separate devices which are connected to the device 106. Thus, the device 106 may not include the speakers in some embodiments.

One or more codecs 202 may be coupled to the microphones 108 and the speaker(s) 110 to encode and/or decode the audio signals. The codec 202 may convert audio data between analog and digital formats. A user 104 may interact with the device 106 by speaking to it, and the microphones 108 may capture sound and generate an audio signal that includes the user speech. The codec 202 may encode the user speech and transfer that audio data to other components. The device 106 can communicate back to the user 104 by emitting audible statements through the speaker(s) 110. In this manner, the user 104 may interact with the voice-controlled device 106 simply through speech, without use of a keyboard or display common to other types of devices.

In the illustrated example, the voice-controlled device 106 may include one or more wireless interfaces 204 coupled to one or more antennas 206 to facilitate a wireless connection to a network. The wireless interface 204 may implement one or more of various wireless technologies, such as Wi-Fi, Bluetooth, RF, and so on.

One or more device interfaces 208 (e.g., USB, broadband connection, etc.) may further be provided as part of the device 106 to facilitate a wired connection to a network, or a plug-in network device that communicates with other wireless networks. One or more power units 210 may be provided to distribute power to the various components of the device 106.

The voice-controlled device 106 may be designed to support audio interactions with the user 104 in the form of receiving voice commands (e.g., words, phrase, sentences, volume controls, etc.) from the user 104 and outputting audible feedback to the user 104. Accordingly, in the illustrated implementation, there are no or few haptic input devices, such as navigation buttons, keypads, joysticks, keyboards, touch screens, and the like. Further there may be no display for text or graphical output. In one implementation, the voice-controlled device 106 may include non-input control mechanisms, such as basic volume control button(s) for increasing/decreasing volume, as well as power and reset buttons. There may also be one or more simple light elements (e.g., light emitting diodes (LEDs) around a perimeter of a portion of the device 106) to indicate a state such as, for example, when power is on or to indicate when a command is received. But, otherwise, the device 106 may not use or need to use any input devices or displays in some instances.

Several modules such as instructions, datastores, and so forth may be stored within the memory 114 and configured to execute on the processor 112. An operating system 212 may be configured to manage hardware and services (e.g., wireless unit, codec, etc.) within, and coupled to, the device 106 for the benefit of other modules.

In addition, the memory 114 may include the speech-recognition engine 116, the audio input components 128, the volume profile module 138, the volume profiles 140, the volume control module 142, and/or the volume attenuation module 144. Also as discussed above, some or all of these modules, data stores, and components may reside additionally or alternatively at the remote computing resources 118, described with reference to FIG. 1.

Figure 3:
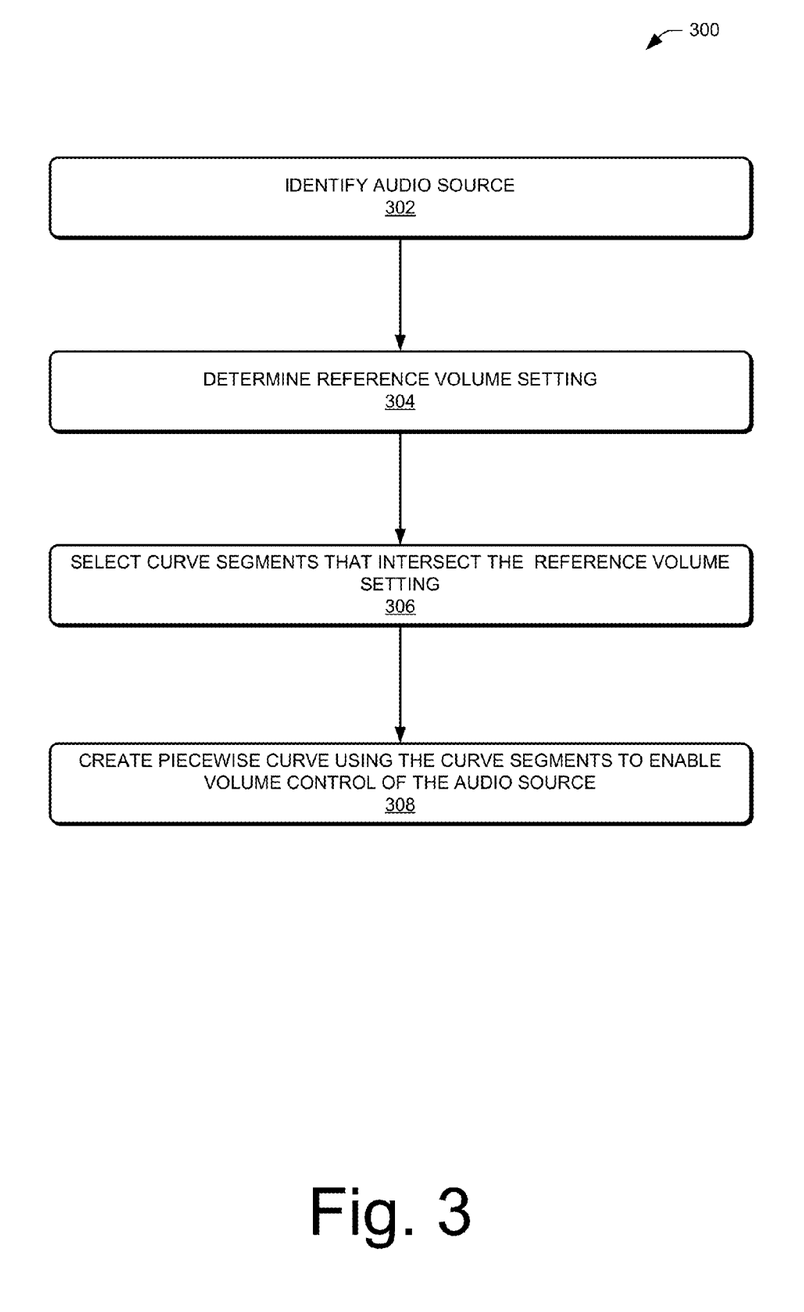
FIG. 3 is a flow diagram of an illustrative process to create a piecewise curve that controls an output of a signal converter to provide volume control of an audio source.

FIG. 3 is a flow diagram of an illustrative process 300 to create a piecewise curve that controls an output of the SC 146 (e.g., a DAC, a DDC, and/or an AAC) to provide volume control of an audio source. FIG. 3 shows the illustrative process 300 illustrated as logical flow graphs, each operation of which represents a sequence of operations that can be implemented in hardware, software, or a combination thereof. In the context of software, the operations represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer-readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process 300. The process 300 is described with reference to the architecture 100, but may be implemented using other architecture and/or devices.

At 302, the volume profile module 138 may identify an audio source that is used to cause output of audio. The audio source may include any of the audio input components 128, such as the media player 130, TTS module 132, and so forth. The audio source may include individual media files, types of files, and/or other groupings or individual sources of audio or applications that process the audio.

At 304, the volume profile module 138 may determine a reference volume setting to be used for the audio source identified at the operation 302. The reference volume setting may be a volume output by the SC 146 for a volume input of one (e.g., volume=1 on scale of 0 to 10, etc.). Thus, the reference volume setting may be a data point that includes a volume for the SC 146 that is associated with the reference volume. In various embodiments, the reference volume may be an initial volume. However, the initial volume (e.g., volume=1, etc.) may not be a lowest possible volume since a potentiometer may provide output levels that are lower than the initial volume setting (e.g., less than volume=1). In some embodiments, the volume profile module 138 may determine other SC outputs for specific volumes, such as for high volumes (e.g., volume=9, volume=10, etc.).

At 306, the volume profile module 138 may select volume curve segments that intersect the reference volume setting and at least one other predetermined output level for the SC 146. For example, the volume profile module 138 may select a first curve that intersects a data point of {SC output=0, volume=0} and a data point associated with the reference volume setting. The volume profile module 138 may select a second curve that interests a data point of {SC output=maximum, volume=10} and the data point associated with the reference volume. However, the volume profile module 138 may select other curve segments and use other data points.

At 308, the volume profile module 138 may create a piecewise curve using the curve segments (e.g., the first curve and the second curve, etc.). The piecewise curve may enable the volume control module 142 to control volume for the audio source identified at the operation 302 using the various curve segments. The piecewise curve may join the curve segments at the reference volume setting to provide a smooth transition between the various curve segments when a user adjusts the volume up or down using a fine volume controller such as the potentiometer.

The volume profile module 138 may store the piecewise curve in the volume profiles 140 for use by the volume control module 142 when controlling volume via the SC 146 for the audio source identified at the operation 302. Example piecewise curves are shown with reference to FIGS. 4-7, and described next.

FIGS. 4-7 show illustrative graphs that include illustrative piecewise curves to control volume of various types of audio output by an electronic device. The graphs show data plotted with respect to a volume percent on an x-axis and an SC output (e.g., amplification output) on a y-axis.

Figure 4:
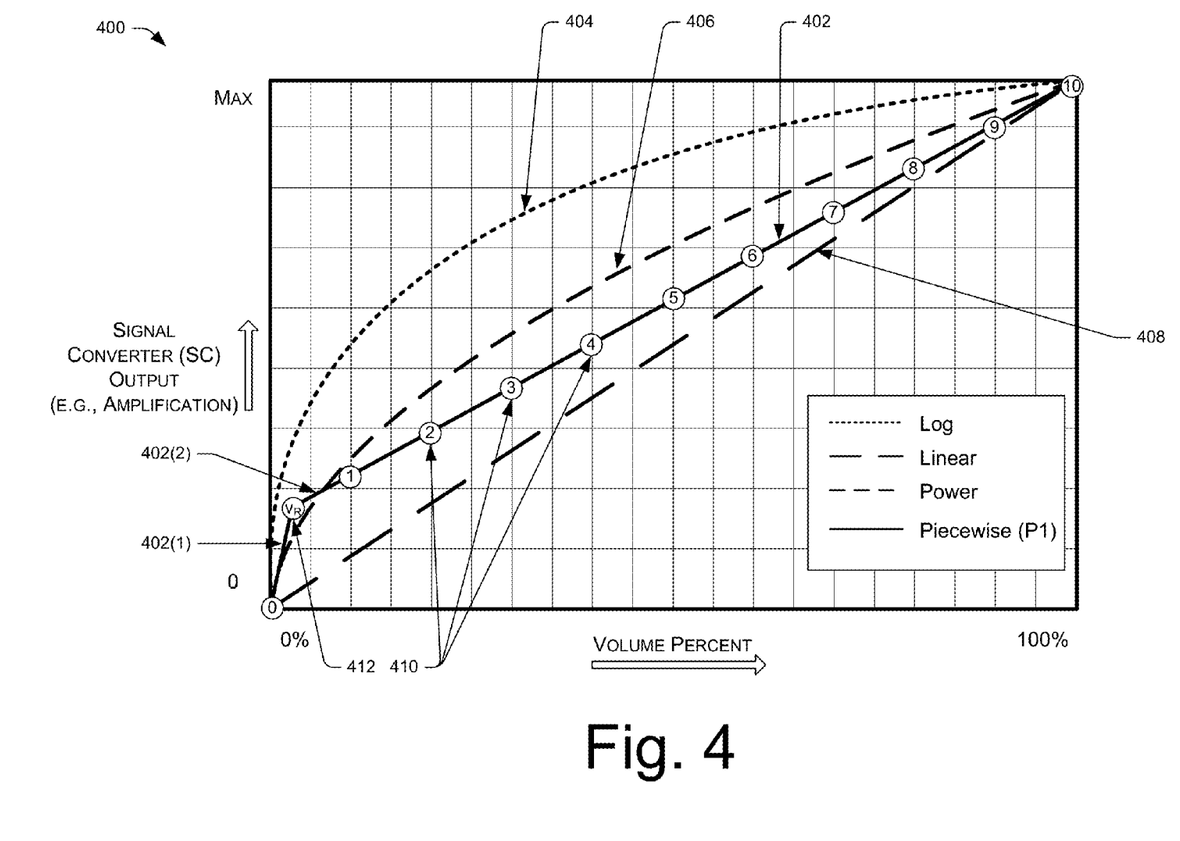
FIGS. 4-7 are graphs showing illustrative piecewise curves to control volume of various types of audio output by an electronic device.

FIG. 4 shows an illustrative graph 400 that includes an example piecewise curve 402 that may be created by the volume profile module 138 in accordance with the process 300. The illustrative graph 400 also includes plots of other types of volume control curves for comparison purposes. A logarithmic curve 404 includes a single continuous curve that follows a logarithmic function used to ramp up values of the SC output quickly in comparison to the volume percent, which corresponds to the volume heard by a listener of the device. A power curve 406 includes a single continuous curve that follows a power function such as $$(x) = y^{\frac{1}{n}},$$

where n>1. The power curve 406 includes a similar profile as the logarithmic curve 404, but includes a lower SC output for lower values of the volume percent as compared to the logarithmic curve 404. A linear curve 408 includes a single continuous curve that intersects {SC output=0, volume=0} and {SC output=maximum, volume=10}. The linear curve includes a significantly lower SC digital volume for lower values of the volume percent as compared to the logarithmic curve 404 and the power curve 406.

The piecewise curve 402 is shown with volume control settings 410, which include a reference volume ($v_R$) 412. The reference volume 412 may be equal to any volume control setting, such as a volume control setting of volume=1. The volume control settings 410 correspond to input values used to identify a location along the piecewise curve. For example, when a user controls the volume of an audio source using a course control, then an input of "volume=2" is associated with a particular data point that associates the volume percent to the SC output. The piecewise curve includes a first curve segment 402(1) and a second curve segment 402(2), which intersect at the reference volume 412. By using the first curve segment 402(1), the piecewise curve 402 may achieve the reference volume at a level similar to the logarithmic curve 404 and the power curve 406, while providing volume control at lower levels than the logarithmic curve 404 and the power curve 406 at greater volumes (e.g., volume inputs greater than 2, etc.). Accordingly, the piecewise curve 402 may provide the user with an anticipated rise in volume as the user controls volume of the audio source using the volume control module 142 which implements the piecewise curve to control the SC output. Although piecewise curve 402 shows the first curve segment 402(1) and the second curve segment 402(2) as being linear curve segments, other types of curve segments may be used to create the piecewise curve.

Figure 5:
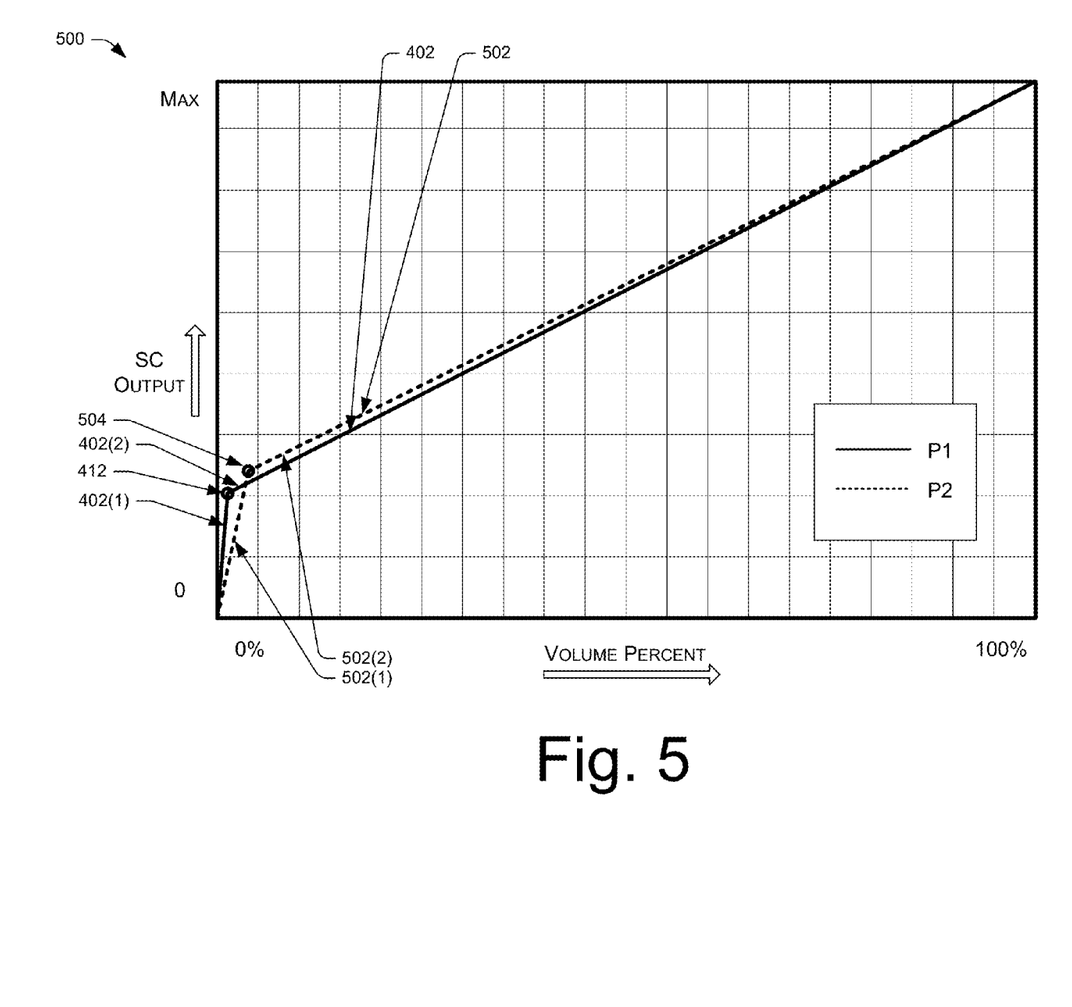

FIG. 5 shows an illustrative graph 500 that includes the piecewise curve 402 and example piecewise curve 502 that may be created by the volume profile module 138 by modifying a data point of the reference volume 412. By moving the reference volume 412 to another data point represented in the graph 500 as a revised reference volume 504, the piecewise curve 504 may be created. The piecewise curve 504 includes a first curve segment 502(1) and a second curve segment 502(2), which intersect at the revised reference volume 504. The first curve segment 502(1) and the second curve segment 502(2) may be anchored at data points {SC output=0, volume=0} and {SC output=maximum, volume=10}, respectively. Thus, the piecewise curve 502 may be created by specifying a location of the data point corresponding to the reference volume or the piecewise curve 502 may be adjusted by modifying a location of the data point corresponding to the reference volume.

The piecewise curve 402 may be associated with a first audio source or first type of audio source while the piecewise curve 502 may be associated with a second audio source or a second type of audio source that is different than the first audio source or the first type of audio source. However, the piecewise curve 402 and the piecewise curve 502 may be associated with a same audio source, which may dynamically adjust the piecewise curve based on other audio sources that are outputting audio at a same time or near a same time. This technique is further discussed with reference to FIG. 8.

Figure 6:
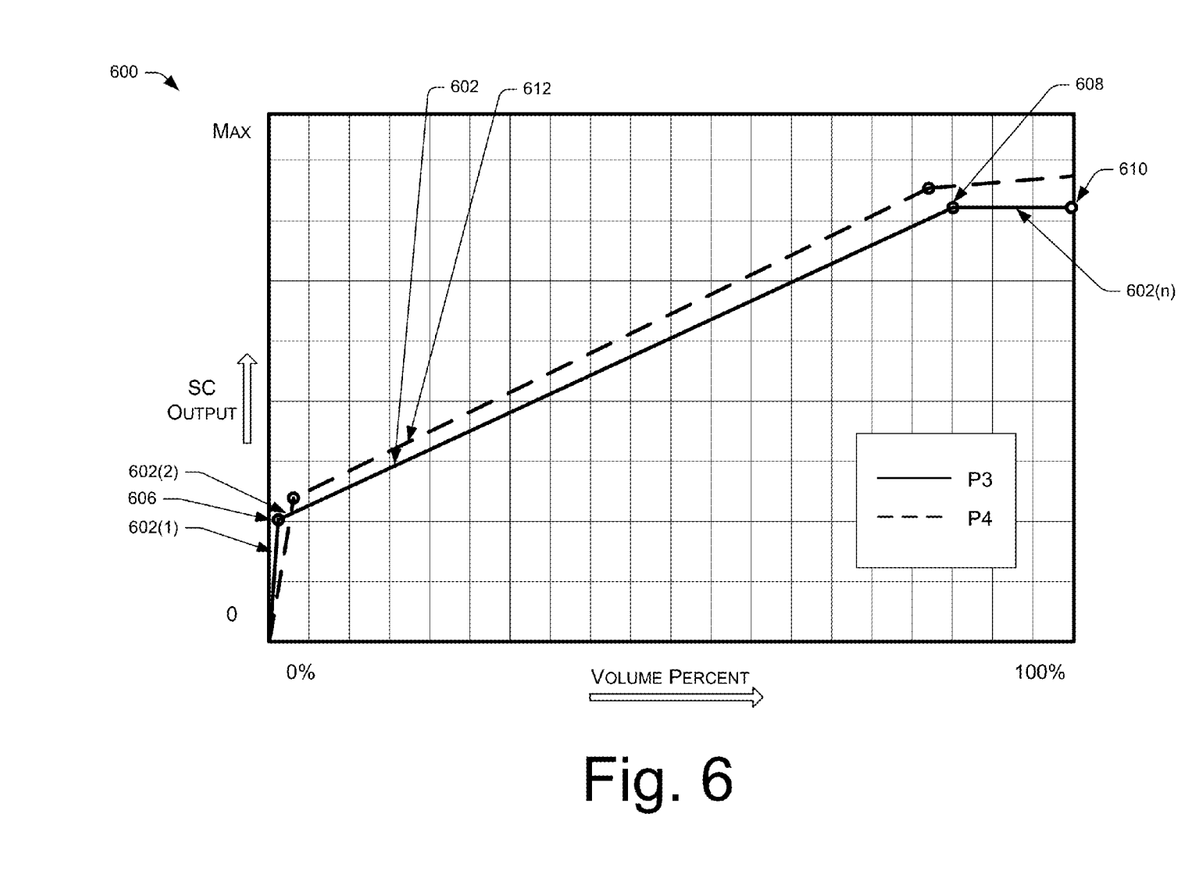

FIG. 6 shows an illustrative graph 600 that includes an example piecewise curve 602 that includes multiple curve segments 604. At least some of the curve segments 602(1)-(n) may intersect a data point associated with a lower reference volume 606 or a data point associated with an upper reference volume 608. For example, a first curve segment may span between a data point {SC output=0, volume=0} and a data point at the lower reference volume 606. A second curve segment may span between the data point at the lower reference volume 606 and the data point at the upper reference volume 608. A third curve segment may span between the data point at the upper reference volume 608 and the data point 610 associated with volume=10. Other curve segments may also be included in the piecewise curve 602.

The data point at the upper reference volume 608 may be used as a volume upper limit or volume ceiling, which may limit a maximum volume for an audio source to be less than a maximum possible volume output by the SC digital volume. For example, when the audio source is provided by the instruction module 134, the volume profile may implement the upper reference volume 608 to create the volume ceiling to prevent the audio output from sounding as though instructions are shouted at the user of the device. Incremental volume increases after (greater than) the upper reference volume 608 may be flat, nominal or incrementally smaller than incremental increases in volume that occur at volumes lower than the upper reference volume 608. Additional data points associated with intermediate reference volumes may also be included in some piecewise curves.

Similar to the relationship between the piecewise curve 402 and the piecewise curve 502, the piecewise curve 602 may be modified by moving or adjusting the location of the data point of the lower reference volume 606, data point of the upper reference volume 608, or both to create a piecewise curve 612.

Figure 7:
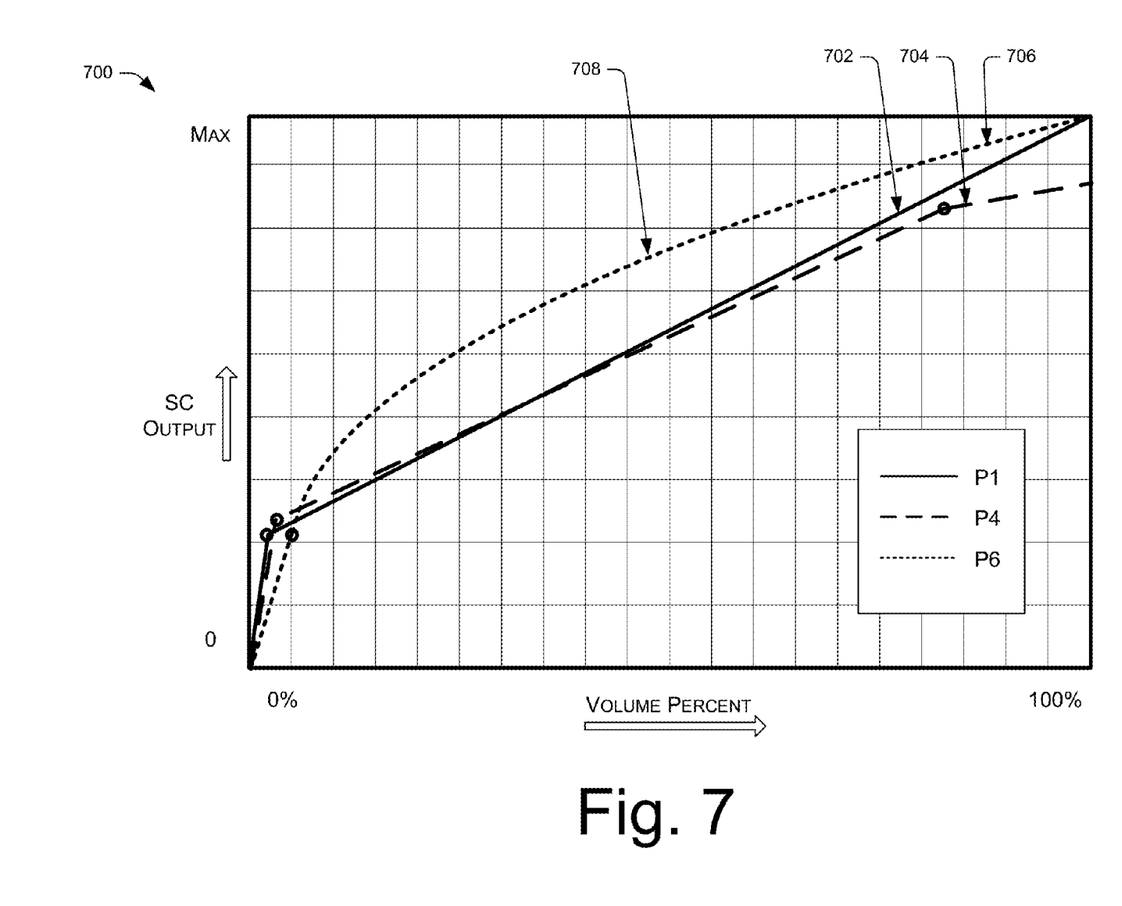

FIG. 7 shows an illustrative graph 700 that includes multiple piecewise curves 702, 704, and 706, which may each be used by different audio sources. However, in some embodiments, a single audio source may dynamically be assigned one of the piecewise curves 702, 704, or 706 at a given time based on other audio sources that are outputting audio at a same time or near a same time. This technique is further discussed with reference to FIG. 8. For example, an audio source may be associated with the piecewise curves 702, 704, or 706 and stored in the volume profiles 140. Each curve may be associated with conditions of use, which may indicate when a particular curve is to be used for the audio source. The conditions of use may be based on other sources of audio that are played or not played at a same time or near a same time as the audio source, levels of ambient noise, and/or other conditions.

The piecewise curve 706 shows inclusion of at least one non-linear curve segment 708 included in the curve segments that are joined to create the piecewise curve 706. In some embodiments, all of the curve segments may be non-linear curve segments, all of the curve segments may be linear curve segments (as shown in the piecewise curves 702 and 704), or the curve segments may include non-linear curve segments and linear curve segments (as shown in the piecewise curve 706).

Figure 8:
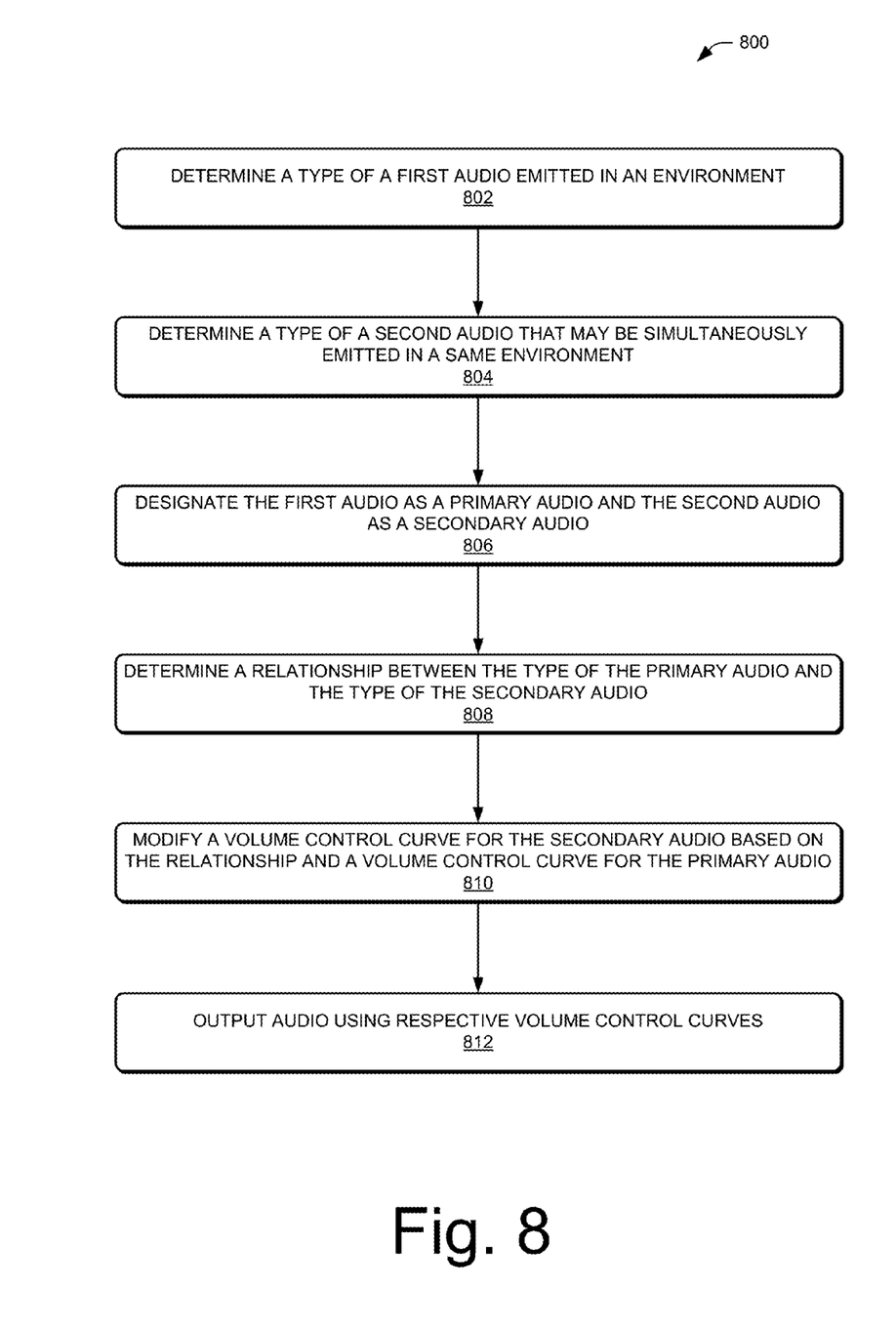
FIG. 8 is a flow diagram of an illustrative process to modify a volume control piecewise curve associated with a secondary audio that is emitted with a primary audio.
Figure 9:
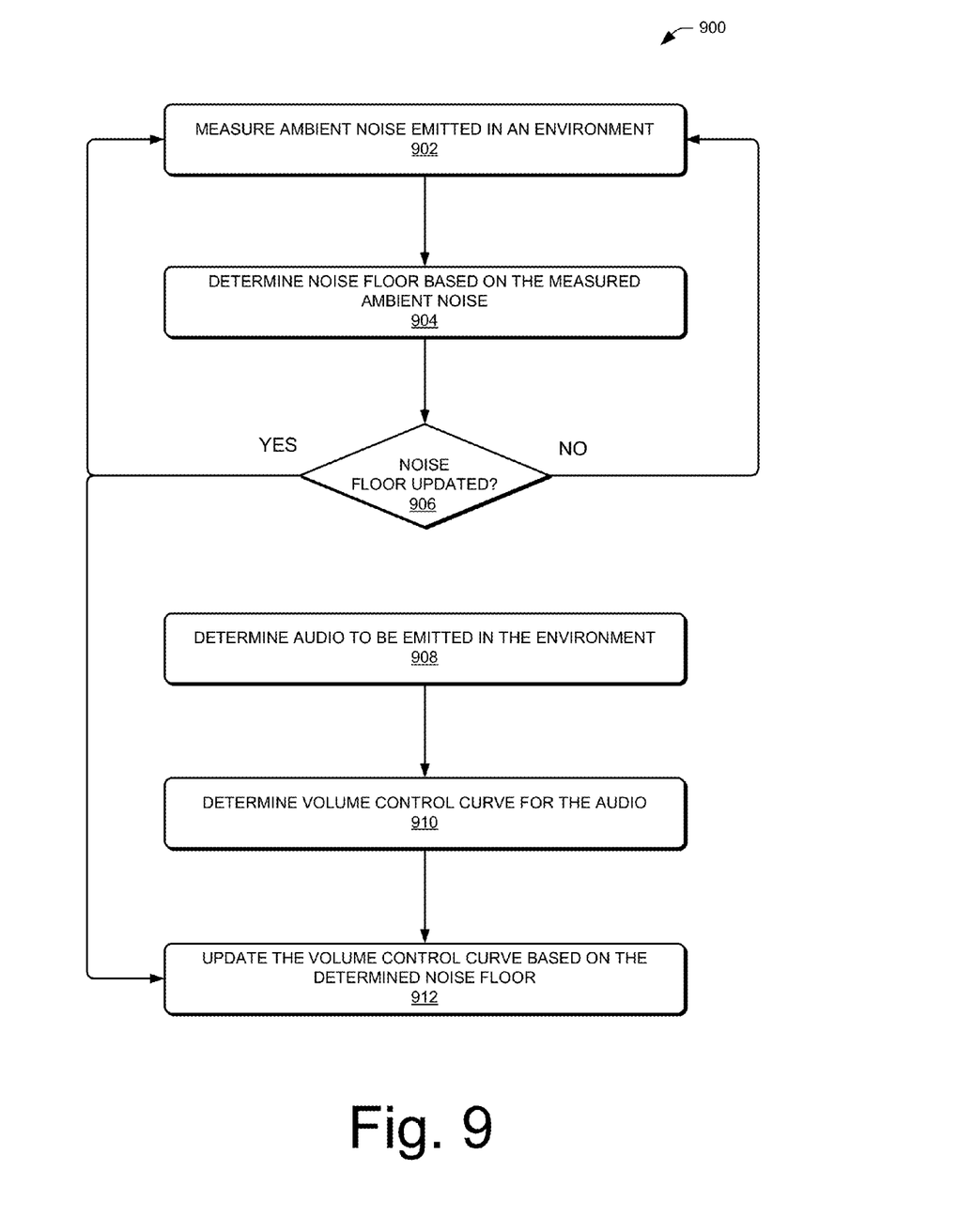
FIG. 9 is a flow diagram of an illustrative process to modify a volume control piecewise curve associated with an audio based in part on a noise floor in an environment.
Figure 10:
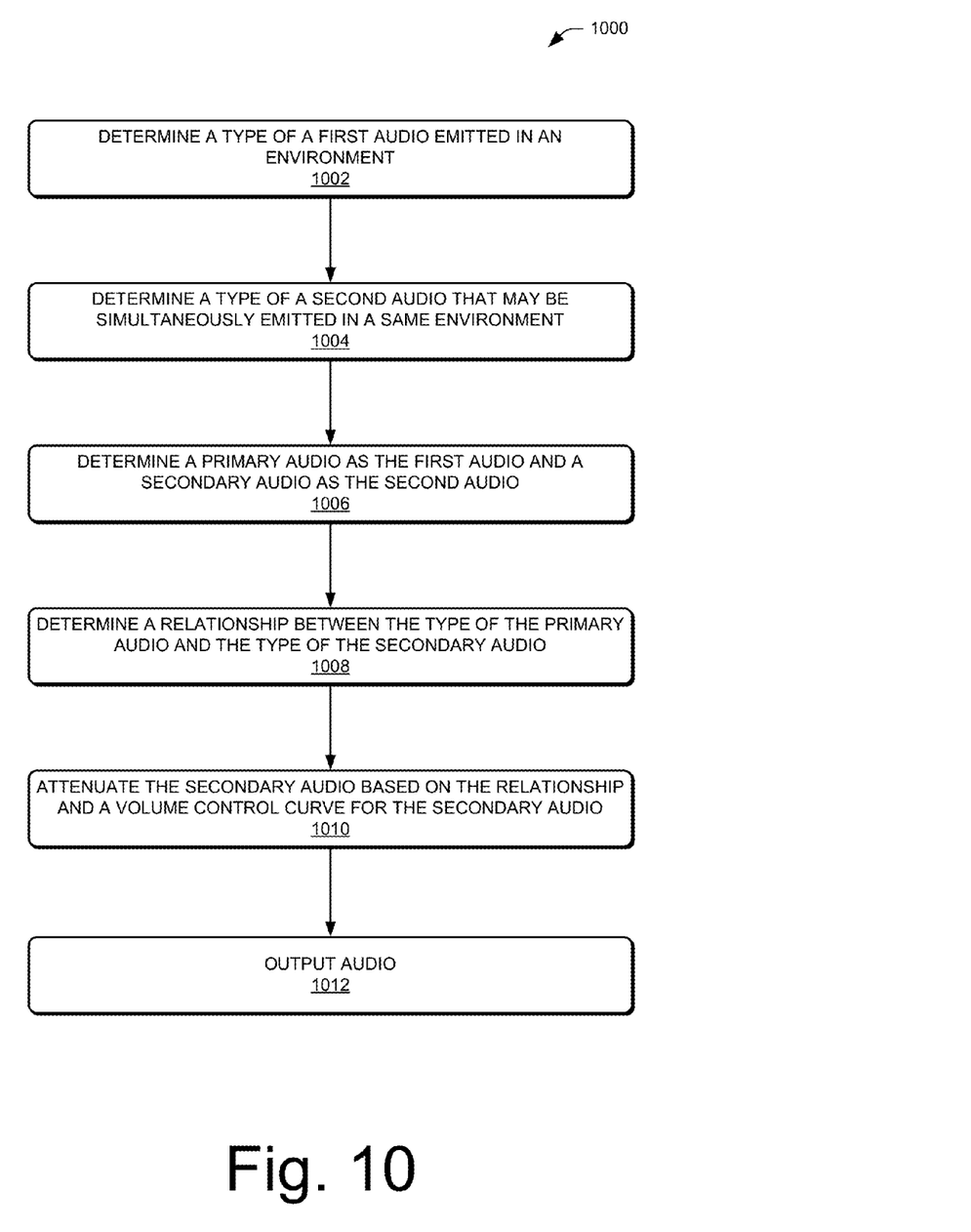
FIG. 10 is a flow diagram of an illustrative process to attenuate a volume control associated with a secondary audio that is emitted with a primary audio.

FIGS. 8, 9 and 10 show illustrative processes illustrated as logical flow graphs, each operation of which represents a sequence of operations that can be implemented in hardware, software, or a combination thereof. In the context of software, the operations represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer-readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some embodiments the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the processes. The processes are described with reference to the architecture 100, but may be implemented using other architecture and/or devices.

FIG. 8 is a flow diagram of an illustrative process 800 to modify a volume control piecewise curve associated with a secondary audio that is emitted with a primary audio. The modification may be based on a relationship between the secondary audio and the primary audio that may cause an audible interference that makes it difficult for a user to distinguish between the audio outputs and/or hear important information in one of the audio outputs (e.g., alarms, instructions, etc.). For example, audible interference may occur when both audio sources include audio output having spoken words, which when played simultaneously or nearly simultaneously, may be distracting, confusing, or otherwise undesirable for a user.

At 802, the volume control module 142 may determine a type of a first audio emitted in an environment. The type of the audio may be determined by any one or combination of a type of file, an application used to read the file, metadata included in the audio, local or remote analysis of the audio, user input, and/or other techniques to determine a type of the audio. The type may include a designation that describes a characteristic of the audio as music, spoken words, an alarm, and announcement, conversation, sound effects, and/or other characteristics of the audio.

At 804, the volume control module 142 may determine a type of a second audio emitted in the environment.

At 806, the volume control module 142 may designate the first audio as a primary audio and the second audio as a secondary audio. The first audio may not necessarily be a played prior to the second audio, but may be designated as a primary audio for many other reasons, such as based on the type of audio (as discussed above with respect to the operation 802), user preferences, user history, predetermined designations or rules, and so forth. For example, when a user is listing to music via the media module 130 and receiving navigational instructions from the instruction module 134, then the music may be designated as the secondary audio because of its relative importance to the user or for other reasons.

At 808, the volume control module 142 may determine a relationship between the type of the primary audio and the type of the second audio based on the operations 802 and 804. In one example, the relationship may indicate that the primary audio and the secondary audio are of a same type (e.g., both music, both spoken words, etc.), and should not be played together at a same SC output level (e.g., amplification) for a given volume. In another example, the relationship may indicate that the primary audio and the secondary audio are of a different type, which may or may not conflict. For example, spoken words may conflict with a type of dialog while spoken words may not conflict with sound effects or music, as possible examples.

At 810, the volume profile module 138 may modify the volume control curve for the secondary audio based on the relationship determined at the operation 808 and based on a volume control curve for the primary audio. For example, the volume profile module 138 may dynamically select a different volume control curve for the secondary audio from associated volume control curves stored in the volume profiles 140. In some embodiments, the volume profile module 138 may dynamically modify a volume control curve by moving the reference volume and/or other data point(s), creating or selecting new curve segments, or otherwise modifying the piecewise curve to change the curve. By changing the curve, the SC output for the secondary audio may be modified without an actual change to the volume input (e.g., volume=1, 2, . . . , 10) for the secondary audio.

At 812, the volume control module 142 may cause output of the audio using the volume control curves for the primary audio and the secondary audio. The output may be based on a same volume input (e.g., volume=1, 2, . . . , 10), which is in contrast with attenuation that changes the volume using a same curve. When the user adjusts the volume control (e.g., adjusts volume from volume=5 to volume=7), then the volume of all audio sources may be adjusted using their respective volume control piecewise curves.

FIG. 9 is a flow diagram of an illustrative process 900 to modify a volume control piecewise curve associated with an audio based in part on a noise floor in an environment.

At 902, the volume control module 142 may use the microphone(s) 108 to measure ambient noise emitted in an environment where audio is output or to be output. The ambient noise may be noise generated by any one or more of other devices, other audio sources, the environment itself, eternal sound, and so forth.

At 904, the volume control module 142 may determine a noise floor based on the measured ambient noise over one or more measurements. The noise floor is a cumulative level of ambient noise, which may represent a moving average or other calculation or amount representative of the amount of ambient noise at a given moment of present time or future time, when used in a predictive model.

At 906, the volume control module 142 may determine whether the noise floor is updated at the operation 904. When the noise floor is not updated (following the "no" route from the decision operations 906), then the process 900 may continue by performing the operations 902 and 904 in a loop.

Meanwhile, the volume control module 142 may process audio for output as shown in operations 908, 910, and 912.

At 908, the volume control module 142 may determine audio to be emitted in the environment.

At 910, the volume control module 142 may determine a volume control curve for the audio determined to be output at the operation 908. In some embodiments, the volume control curve may be a piecewise curve. The volume control curve may be retrieved from the volume profiles 140.

At 912, the volume profile module 138 may update the volume control curve based on the determined noise floor at the operation 904. In some embodiments, the volume profile module 138 may perform the update by adjusting a piecewise curve by moving one or more data points, such as the reference volume, which in turn may create different curve segments that form the piecewise curve. As an example, a selection of a reference volume having a higher SC output may be performed when the noise floor is measured as having increased while a selection of a reference volume having a lower SC output may be performed when the noise floor is measured as having decreased. However, other techniques may be used to select a different volume control curve for the audio and/or adjust the volume control curve for the audio.

Meanwhile, when the noise floor is updated (following the "yes" route from the decision operation 906), then the process 900 may cause an update of the volume control at the operation 912 and the process 900 may continue by performing the operations 902 and 904 in a loop.

FIG. 10 is a flow diagram of an illustrative process 1000 to attenuate a volume control associated with a secondary audio that is emitted with a primary audio. The attenuation may be performed in conjunction with the process 800 and/or the process 900.

At 1002, the volume control module 142 may determine a type of a first audio emitted in an environment, similar to the determination discussed with respect to the operation 802 of the process 800 described above.

At 1004, the volume control module 142 may determine a type of a second audio emitted in the environment.

At 1006, the volume control module 142 may designate first audio as a primary audio and the second audio as a secondary audio. The first audio may not necessarily be a played prior to the second audio, but may be designated as a primary audio for many other reasons, such as based on the type of audio (as discussed above with respect to the operation 1002), user preferences, user history, predetermined designations or rules, and so forth. For example, when a user is listing to music via the media module 130 and receiving navigational instructions from the instruction module 134, then the music may be designated as the secondary audio because of its relative importance to the user or for other reasons.

At 1008, the volume control module 142 may determine a relationship between the type of the primary audio and the type of the second audio based on the operations 1002 and 1004. In one example, the relationship may indicate that the primary audio and the secondary audio are of a same type (e.g., both music, both spoken words, etc.), and should not be played together at a same SC output level for a given volume. In another example, the relationship may indicate that the primary audio and the secondary audio are of a different type, which may or may not conflict. For example, spoken words may conflict with a type of dialog while spoken words may not conflict with sound effects or music, as possible examples.

At 1010, the volume attenuation module 144 may attenuate the secondary audio based on the relationship determined at the operation 1008 and based on the volume control curve for the secondary audio. For example, the volume profile module 138 may reduce the volume for the secondary audio by reducing the volume input dynamically (e.g., without user input) or increase the volume for the secondary audio by increasing the volume input dynamically. The amount of the attenuation may vary based on the determined relationship. For example, when the relationship determines that the primary audio and the secondary audio are different and do not conflict (e.g., music and spoken words, etc.), then the attenuation may be less than an attenuation implemented when the primary audio and the secondary audio conflict (e.g., are of a same type).

At 1012, the volume control module 142 may cause output of the audio using any attenuation implemented at the operation 1010.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. An audio device comprising:
   memory;
   one or more processors; and
   one or more computer-executable instructions stored in the memory and executable by the one or more processors to:
      associate audio input signals derived from audio data with at least a first function, the first function including at least a second function and a third function joined by a common data point to form the first function, the first function including a contiguous dataset associated with a given noise floor, the contiguous dataset to create audio output signals having different amplification associated with the given noise floor than the audio input signals, wherein the first function includes, for a given input value, at most one output value;
      receive a volume control setting; and
      convert the audio input signals into the audio output signals using the first function including the contiguous dataset and the volume control setting.

2. The audio device as recited in claim 1, the one or more computer-executable instructions further executable by the one or more processors to convert the audio input signals into the audio output signals using at least one of:
   a digital-to-analog converter that uses the contiguous dataset to convert the audio input signals that are digital input signals into the audio output signals that are analog output signals, or
   a digital-to-digital converter that uses the contiguous dataset to convert the audio input signals into the audio output signals.

3. The audio device as recited in claim 1, the one or more computer-executable instructions further executable by the one or more processors to determine the noise floor as an average of ambient noise over a given time period.

4. The audio device as recited in claim 1, wherein the common data point is associated with a reference volume setting that is an initial volume, the one or more computer-executable instructions further executable by the one or more processors to create the contiguous dataset at least in part by determining a location of the common data point.

5. The audio device as recited in claim 4, the one or more computer-executable instructions further executable by the one or more processors to modify the contiguous dataset at least in part by determining a new location of the common data point.

6. The audio device as recited in claim 1, wherein the audio data includes first audio data associated with first audio input signals and second audio data associated with second audio input signals, the first audio input signals being from a different audio source than the second audio input signals, the one or more computer-executable instructions further executable by the one or more processors to associate the first audio data with a first contiguous dataset and associate the second audio data with a second contiguous dataset that is different than the first contiguous dataset.

7. The audio device as recited in claim 6, the one or more computer-executable instructions further executable by the one or more processors to dynamically associate a third, different, contiguous dataset to at least one of the first audio data or the second audio data in response to the first audio data being output at a same time or near a same time as the second audio data.

8. The audio device as recited in claim 1, wherein the noise floor includes a cumulative level of ambient noise associated with a given time period, and further comprising at least one microphone to generate audio signals to measure the ambient noise, the one or more computer-executable instructions further executable by the one or more processors to select the at least the second function and the third function based at least in part on the ambient noise.

9. The audio device as recited in claim 1, the one or more computer-executable instructions further executable by the one or more processors to receive the volume control setting via a potentiometer and at least one of a voice command or a user selection from a graphical user interface.

10. A device comprising:
    memory;
    one or more processors; and
    one or more computer-executable instructions stored in the memory and executable by the one or more processors to:
       receive a volume control setting;
       convert audio input signals into audio output signals using a contiguous dataset and the volume control setting, wherein converting the audio input signals into the audio output signals causes the audio output signals to have a different amplification than the audio input signals for a given noise floor; and
       determine at least a first function and a second function that are joined by a common data point to form a third function, the third function including the contiguous dataset for the given noise floor.

11. The device as recited in claim 10, the one or more computer-executable instructions further executable by the one or more processors to dynamically adjust or replace one or both of the first function or the second function based at least in part on detection of another audio source.

12. The device as recited in claim 10, wherein the noise floor includes ambient noise associated with a given time period, the one or more computer-executable instructions further executable by the one or more processors to:
    measure a change in the ambient noise in an environment; and
    dynamically adjust or replace one or both of the first function or the second function based at least in part on the change in the ambient noise in the environment.

13. The device as recited in claim 10, further comprising a digital-to-digital converter that converts the audio input signals as digital input signals into the audio output signals as digital output signals.

14. The device as recited in claim 10, wherein the common data point is a first common data point, the one or more computer-executable instructions further executable by the one or more processors to associate a fourth function with a volume upper setting, the third function including at least a portion of the fourth function, and the fourth function joined with the second function at a second common data point to form the contiguous dataset.

15. The device as recited in claim 10, further comprising receiving the audio input signals from another device.

16. A method comprising:
    receiving audio input signals derived from audio data;
    associating audio input signals with at least a first function, the first function including at least a second function and a third function joined at a common data point to form the first function, the first function including a contiguous dataset for a given noise floor;
    generating, using the contiguous dataset, audio output signals having different amplification with the given noise floor than the audio input signals;
    receiving a volume control setting; and
    converting the audio input signals into the audio output signals using the first function including the contiguous dataset and the volume control setting.

17. The method as recited in claim 16, further comprising determining the common data point based at least in part on a reference volume setting that is an initial volume.

18. The method as recited in claim 16, wherein the given noise floor includes a cumulative level of ambient noise associated with a given time period, and further comprising determining the ambient noise, the method further comprising selecting the at least the second function and the third function based at least in part on the ambient noise.

19. The method as recited in claim 16, further comprising selecting the at least the second function and the third function from at least one of linear functions or non-linear functions.

20. The method as recited in claim 16, further comprising causing output of the audio output signals.

21. The method as recited in claim 16, wherein the converting the audio input signals into the audio output signals further comprises using a digital-to-analog converter that uses the contiguous dataset to convert the audio input signals that are digital input signals into the audio output signals that are analog output signals.

\* \* \* \* \*